United States Patent
Narang et al.

(10) Patent No.: US 9,746,864 B1
(45) Date of Patent: Aug. 29, 2017

(54) FAST TRANSIENT LOW DROP-OUT VOLTAGE REGULATOR FOR A VOLTAGE-MODE DRIVER

(71) Applicant: Xilinx, Inc., San Jose, CA (US)

(72) Inventors: Nakul Narang, Singapore (SG); Kee Hian Tan, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/234,584

(22) Filed: Aug. 11, 2016

(51) Int. Cl.
| | |
|---|---|
| *G05F 1/00* | (2006.01) |
| *G05F 1/56* | (2006.01) |
| *H03K 17/687* | (2006.01) |
| *H03F 3/45* | (2006.01) |
| *H04B 1/04* | (2006.01) |
| *H04B 1/16* | (2006.01) |

(52) U.S. Cl.
CPC ........... *G05F 1/56* (2013.01); *H03F 3/45192* (2013.01); *H03K 17/6872* (2013.01); *H04B 1/04* (2013.01); *H04B 1/16* (2013.01)

(58) Field of Classification Search
CPC ........ G05F 1/56; H03K 17/6872; H04B 1/16; H04B 1/04; H03F 3/45192
See application file for complete search history.

(56) References Cited

U.S. PATENT DOCUMENTS

| 7,183,755 B2* | 2/2007 | Itoh | H02H 9/025 323/274 |
|---|---|---|---|
| 7,362,080 B2* | 4/2008 | Sohn | G05F 1/573 323/277 |
| 8,169,204 B2* | 5/2012 | Jian | G05F 1/573 323/273 |
| 8,810,510 B2* | 8/2014 | Doi | G06F 3/018 345/157 |
| 8,928,296 B2* | 1/2015 | Iriarte | G05F 1/56 323/280 |

OTHER PUBLICATIONS

Carvajal, Ramon Gonzalez et al., "The Flipped Voltage Follower: A Useful Cell for Low-Voltage Low-Power Circuit Design," IEEE Transactions on Circuits and Systems—I: Regular Papers, Jul. 2005, pp. 1276-1291, vol. 52, No. 7, IEEE, Piscataway, New Jersey, USA.
Lu, Yan et al., "A 0.65ns-Response-Time 3.01ps FOM Fully-Integrated Low-Dropout Regulator with Full-Spectrum Dower-Supply-Rejection for Wideband Communication Systems," Digest of Technical Papers, 2014 IEEE Internatonal Solid-State Circuits Conference, Feb. 11, 2014, pp. 306-307, IEEE, Piscataway, New Jersey, USA.

* cited by examiner

*Primary Examiner* — Kenneth B Wells
(74) *Attorney, Agent, or Firm* — Robert M. Brush (57) ABSTRACT

An example voltage regulator includes an output transistor that includes a source coupled to a first voltage supply node and a drain coupled to an output node. The voltage regulator further includes a first transistor that includes a source coupled to the output node, and a second transistor that includes a source coupled to a gate of the output transistor and a drain coupled to a second voltage supply node. The voltage regulator further includes a resistor coupled between the second voltage supply node and a first node that includes the drain of the first transistor and a gate of the second transistor. The voltage regulator further includes an error amplifier that includes a first input coupled to a reference voltage node, a second input coupled to the output node, and an output coupled to a gate of the first transistor.

20 Claims, 4 Drawing Sheets

FAST TRANSIENT LOW DROP-OUT VOLTAGE REGULATOR FOR A VOLTAGE-MODE DRIVER

TECHNICAL FIELD

Examples of the present disclosure generally relate to electronic circuits and, in particular, to a fast transient low drop-out (LDO) voltage regulator for a voltage-mode driver.

BACKGROUND

In serial communication systems, a large percentage of the total power is consumed in the transmitter, which must provide for adequate signal swing on a low-impedance channel while maintaining an appropriate source termination. In addition, the transmitter often includes equalization to compensate for frequency-dependent loss in the channel. The driver circuit in the transmitter often consumes the majority of the power of the transmitter. Driver circuits can be implemented as current-mode drivers or voltage-mode drivers. Voltage-mode drivers are known to consume far less power in comparison to current-mode drivers. For example, a voltage-mode driver can consume four times less DC power than a current-mode driver to provide the same output swing.

A voltage-mode driver for a transmitter requires swing and impedance control such that the swing and common-mode/differential-mode return loss are within specifications. One technique for output signal swing control in a driver circuit is to use a single voltage regulator to generate a reference voltage that sets the voltage swing. However, with a single regulator, the common-mode will shift as the output swing of the driver circuit changes. Such a shift in the common-mode can cause the return loss to exceed specifications. Further, conventional low drop-out (LDO) voltage regulators suffer from large ripple, which results in large jitter. Deterministic jitter is an important specification of transmitter driver. A voltage regulator in the transmitter driver should suppress supply ripple as much as possible to have low jitter.

SUMMARY

Techniques for providing a fast transient low drop-out (LDO) voltage regulator for a voltage-mode driver are described. In an example, a voltage regulator includes an output transistor that includes a source coupled to a first voltage supply node and a drain coupled to an output node. The voltage regulator further includes a first transistor that includes a source coupled to the output node, and a second transistor that includes a source coupled to a gate of the output transistor and a drain coupled to a second voltage supply node. The voltage regulator further includes a resistor coupled between the second voltage supply node and a first node that includes the drain of the first transistor and a gate of the second transistor. The voltage regulator further includes an error amplifier that includes a first input coupled to a reference voltage node, a second input coupled to the output node, and an output coupled to a gate of the first transistor.

In another example, a driver circuit includes a voltage-mode output driver and a voltage regulator coupled to the voltage-mode output driver. The voltage regulator provides an output voltage to the voltage-mode output driver. The voltage regulator includes an output transistor that includes a source coupled to a first voltage supply node and a drain coupled to an output node, which supplies the output voltage. The voltage regulator further includes a first transistor that includes a source coupled to the output node, and a second transistor that includes a source coupled to a gate of the output transistor and a drain coupled to a second voltage supply node. The voltage regulator further includes a resistor coupled between the second voltage supply node and a first node that includes the drain of the first transistor and a gate of the second transistor. The voltage regulator further includes an error amplifier that includes a first input coupled to a reference voltage node, a second input coupled to the output node, and an output coupled to a gate of the first transistor.

In another example, a voltage regulator includes an output transistor that includes a source coupled to a first voltage supply node and a drain coupled to an output node that supplies a regulated output voltage. A DC regulation loop includes a first source follower configured to control the regulated output voltage and an error amplifier configured to control the first source follower. A fast transient loop that includes a second source follower, a resistor, and the first source follower, the second source follower configured to control the output transistor. A voltage between the resistor and the first source follower controls the second source follower.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a fast transient low drop-out (LDO) voltage regulator for a voltage-mode driver are described. In an example, a voltage regulator includes an output transistor having a source coupled to a first voltage supply node and a drain coupled to an output node. A first transistor includes a source coupled to the output node. A second transistor includes a source coupled to a gate of the output transistor and a drain coupled to a second voltage supply node. A resistor is coupled between the second voltage supply node and a first node that includes the drain of the first transistor and a gate of the second transistor. An error amplifier includes a first input coupled to a reference voltage node, a second input coupled to the output node, and an output coupled to a gate of the first transistor.

The voltage regulator regulates output voltage by controlling the voltage at the output node using a DC regulation loop and a fast transient loop. The DC regulation loop includes a source follower, formed by the first transistor and the output transistor, and the error amplifier. The fast transient loop includes another source follower, formed by the second transistor and a current source, which controls the gate voltage of the output transistor. The second transistor acts as a level-shifter and creates a low impedance pole at the gate of the output transistor. The dominant pole is at the output node and two non-dominant poles are in the gigahertz (GHz) range. This allows the voltage regulator to achieve high bandwidth. This significantly mitigates output ripple at the output node. Rather than using two separate loops, the DC regulation loop and the fast transient loop are coupled in the voltage regulator (through the first source follower). These and further aspects are described below with respect to the drawings.

Figure 1:
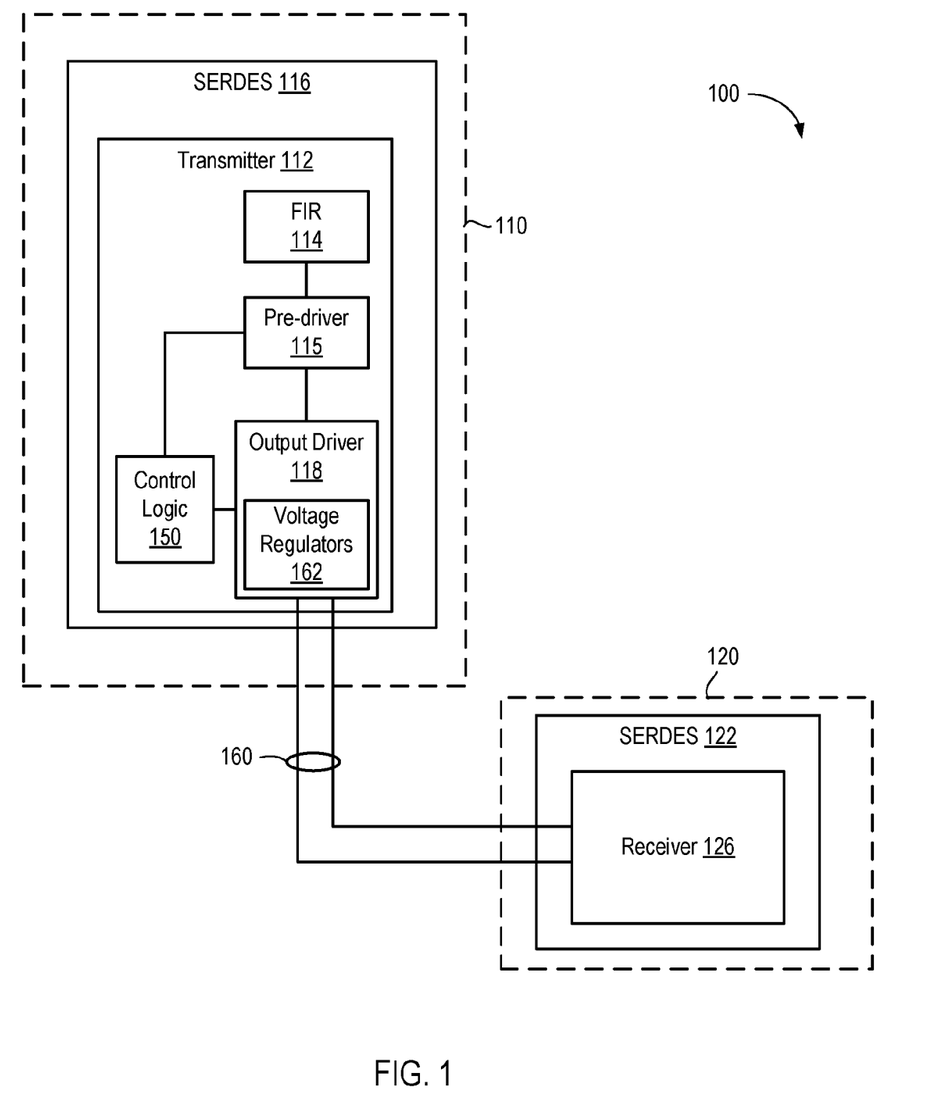
FIG. 1 is a block diagram depicting an example of a serial communication system.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SERDES) 116. The receiver 126 can be part of a SERDES 122. The transmission medium 160 comprises an electrical path between the transmitter 112 and the receiver 126 and can include printed circuit board (PCB) traces, vias, cables, connectors, decoupling capacitors, and the like. In examples, the transmission medium 160 includes a matched pair of transmission lines each having a characteristic impedance ($Z_0$). The receiver of the SERDES 116, and the transmitter of the SERDES 122, are omitted for clarity. In some examples, the SERDES 116 can be disposed in an integrated circuit (IC) 110, and the SERDES 122 can be disposed in an IC 120.

In general, the transmitter 112 generates a serial data signal from a parallel data path (serialization). The serial data signal has a particular data rate (symbol rate). In some examples, data bytes from the parallel data path can be encoded prior to serialization using, for example, and 8B/10B encoder or the like. The transmitter 112 drives the serial data signal onto the transmission medium 160 using a digital modulation technique, such as binary non-return-to-zero (NRZ) pulse amplitude modulation (PAM). The transmission medium 160 propagates electrical signal(s) representing symbols of the serial data signal (e.g., logic "1" and logic "0") towards the receiver 126.

In the example shown, the transmission medium 160 is a differential channel. Data on the differential channel is represented using two electrical signals ("true" and "complement" signals). A logic "0" is represented by driving the true signal to its lower voltage limit and driving the complement signal to its upper voltage limit. A logic "1" is represented by driving the true signal to its upper voltage limit and driving the complement signal to its lower voltage limit. Thus, the logic value of each transmitted symbol is based on the difference between the true and complement signals, and not based on the level of either signal individually. The peak-to-peak difference between the true signal and the complement signal is the voltage swing (also referred to as signal swing or swing).

The transmitter 112 includes a finite impulse response (FIR) filter 114, a pre-driver 115, an output driver 118, and control logic 150. The transmitter 112 is configured to equalize the serial data signal prior to transmission over the transmission medium 160. The FIR 114 can be used to mitigate pre-cursor inter-symbol interference (ISI) caused by the transmission medium 160. The transmission medium 160 degrades the signal quality of the transmitted signal. Channel insertion loss is the frequency-dependent degradation in signal power of the transmitted signal. When signals travel through a transmission line, the high frequency components of the transmitted signal are attenuated more than the low frequency components. In general, channel insertion loss increases as frequency increases. Signal pulse energy in the transmitted signal can be spread from one symbol period to another during propagation on the transmission medium 160. The resulting distortion is known as ISI. In general, ISI becomes worse as the speed of the communication system increases.

The output of the FIR filter 114 is coupled to an input of the pre-driver 115. The output of the FIR filter 114 can include a plurality of signals, including a main-cursor signal, and one or more pre-cursor signals, one or more post-cursor signals, or a plurality of post-cursor and pre-cursor signals. For purposes of clarity by example, the present description assumes the FIR filter 114 outputs one main-cursor signal, one pre-cursor signal, and one post-cursor signal. The pre-driver 115 is configured to couple the output of the FIR filter 114 to the output driver 118. As discussed below, the output driver 118 is segmented and includes a plurality of output circuits coupled in parallel to the transmission medium 160. The pre-driver 115 couples each of the main-cursor, the pre-cursor, and the post-cursor signals to a selected percentage of the output circuits of the output driver 118. The percentages of output circuits driven by the main-cursor, pre-cursor, and post-cursor signals as selected by the pre-driver 115 is controlled by the control logic 150. The control logic 150 also controls aspects of the output driver 118, as discussed further below.

Figure 3:
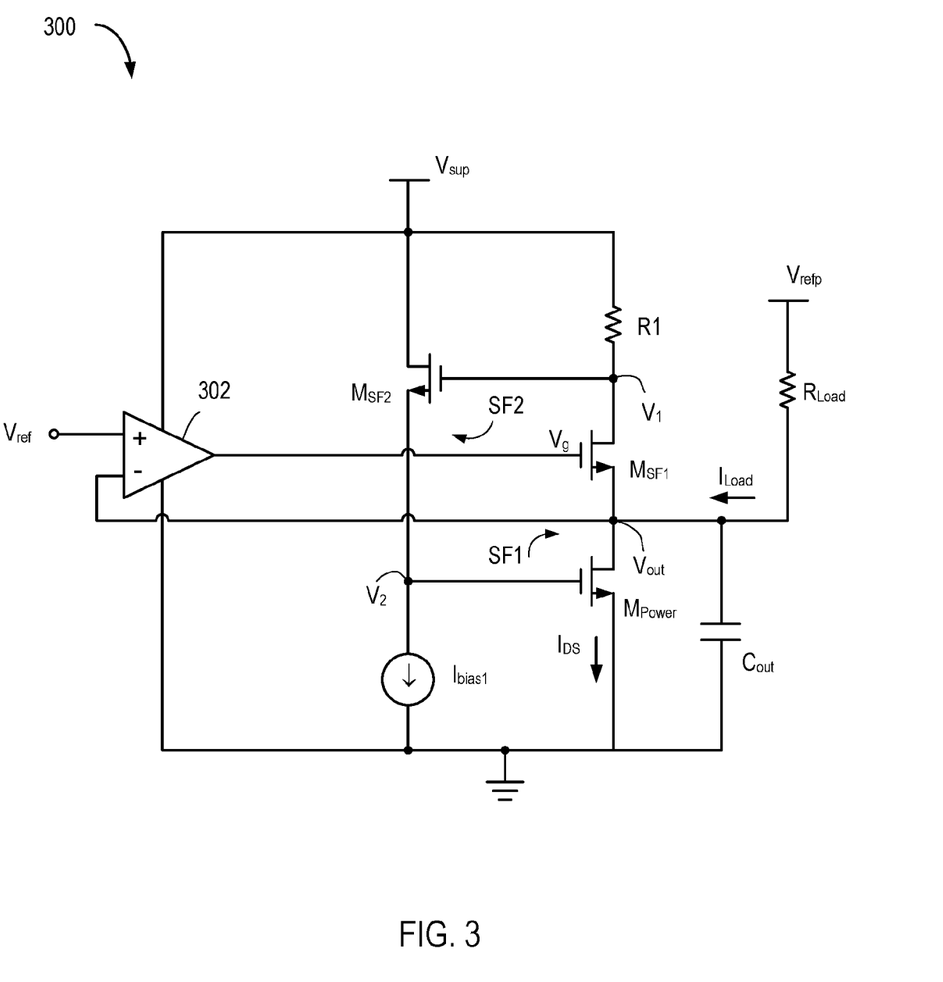
FIG. 3 is a schematic diagram depicting a voltage regulator according to an example.

The output driver 118 couples a differential signal to the transmission medium 160. In an example, the output driver 118 includes a pair of voltage regulators 162 that supply upper and lower voltages to circuits of the output driver 118. An example voltage regulator is shown in FIG. 3 and described below.

While the SERDES 116 and the SERDES 122 are shown, in other examples, each of the transmitter 112 and/or the receiver 126 can be a stand-alone circuit not being part of a larger transceiver circuit. In some examples, the transmitter 112 and the receiver 126 can be part of one or more integrated circuits (ICs), such as application specific integrated circuits (ASICs) or programmable ICs, such as field programmable gate arrays (FPGAs).

Figure 2:
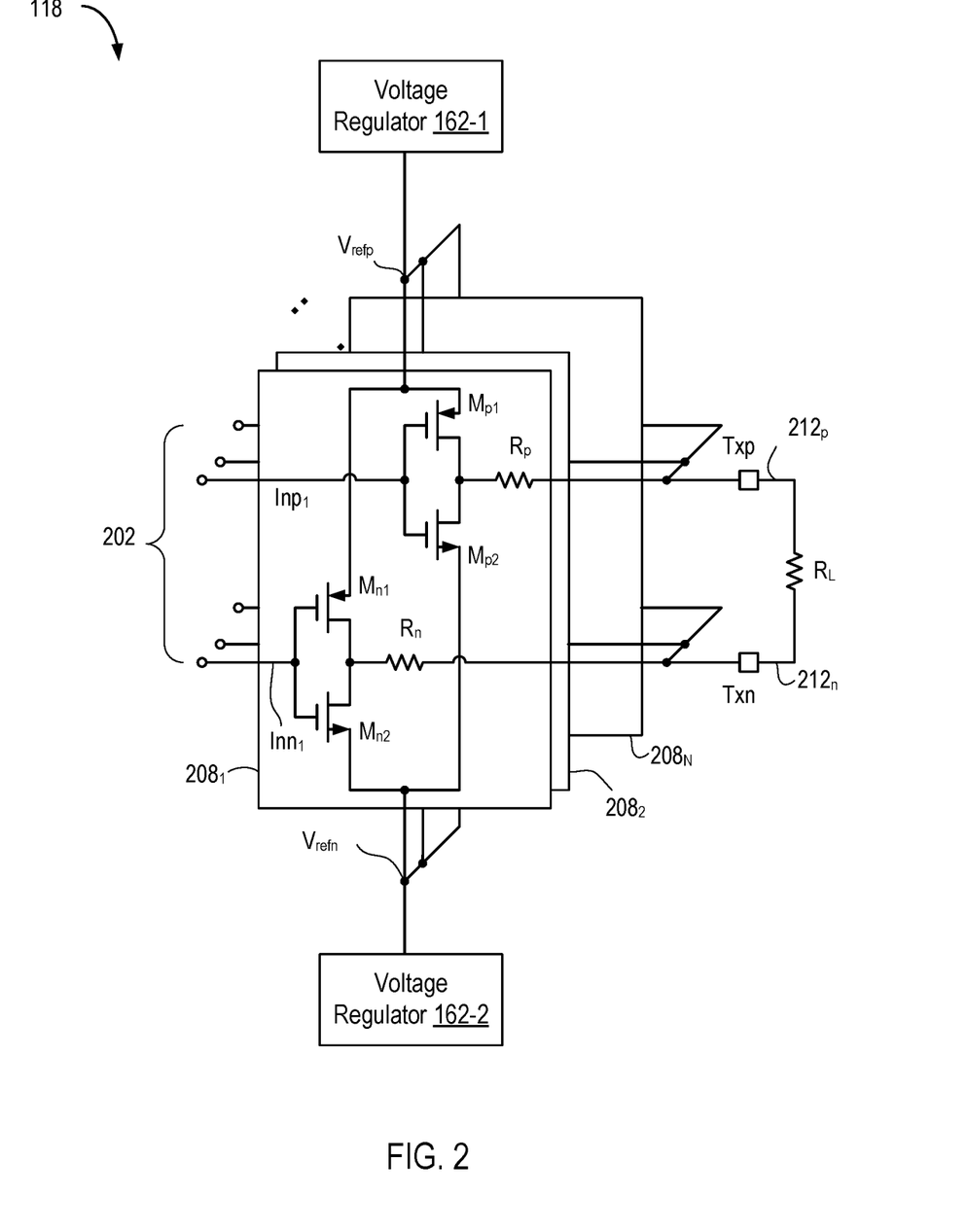
FIG. 2 is a schematic diagram depicting an output driver according to an example.

FIG. 2 is a schematic diagram depicting the output driver 118 according to an example. The output driver 118 includes output circuits $208_1$ through $208_N$ (where N is an integer greater than one) and voltage regulators $162_1$ and $162_2$. The output circuits $208_1$ through $208_N$ are collectively referred to as output circuits 208. The voltage regulators $162_1$ and $162_2$ are collectively referred to as voltage regulators 162.

The output circuits 208 are coupled in parallel between a differential input 202 and a differential output (Txp, Txn). The differential input 202 includes N differential signals output by the pre-driver 115. Each differential signal includes a true signal, Inp, and a complement signal, Inn. Thus, the differential input 202 includes signals $Inp_1$ through $Inp_N$ and signals $Inn_1$ through $Inn_N$.

The output circuits 208 are coupled to common nodes $V_{refp}$ and $V_{refn}$. Each of the output circuits 208 includes transistors $M_{p1}$, $M_{p2}$, $M_{n1}$, and $M_{n2}$. Each of the output circuits 208 also includes resistors $R_p$ and $R_n$. The transistors $M_{p1}$ and $M_{n1}$ comprise p-channel field effect transistors (FETs), such as P-type metal-oxide semiconductor FETs (MOSFETs) (also referred to as PMOS transistors). The transistors $M_{p2}$ and $M_{n2}$ comprise n-channel FETs, such as N-type MOSFETs (also referred to as NMOS transistors). For purposes of clarity, only the output circuit $208_1$ is shown in detail. However, each of the output circuits $208_2$ through $208_N$ are configured identically with the output circuit $208_1$.

Sources of the transistors $M_{p1}$ and $M_{n1}$ are coupled to the common node $V_{refp}$. Drains of the transistors $M_{p1}$ and $M_{n1}$ are coupled to drains of the transistors $M_{p2}$ and $M_{n2}$, respectively. Sources of the transistors $M_{p2}$ and $M_{n2}$ are coupled to the common node $V_{refn}$. Gates of the transistors $M_{p1}$ and $M_{p2}$ are coupled together and are coupled to receive a signal Inp of one of the input differential signals. Gates of the transistors $M_{n1}$ and $M_{n2}$ are coupled together and are coupled to receive a signal Inn of one of the input differential signals. A first terminal of the resistor $R_P$ is coupled to the drains of the transistors $M_{p1}$ and $M_{p2}$, and a second terminal of the resistor $R_P$ is coupled to the node Txp of the differential output. A first terminal of the resistor $R_n$ is coupled to the drains of the transistors $M_{n1}$ and $M_{n2}$, and a second terminal of the resistor $R_n$ is coupled to the node Txn of the differential output. The transistors $M_p i$ and $M_p g$ form a first inverter ($M_p$), and the transistors $M_{n1}$ and $M_{n2}$ form a second inverter ($M_n$). A series combination of the pair of inverters ($M_p$, $M_n$) and the pair of resistors $R_p$ and $R_n$ is coupled between the differential input 202 and the differential output (Txp, Txn). The source terminals of the inverters are coupled between the nodes $V_{refp}$ and $V_{refn}$.

The voltage regulator $162_1$ is coupled to the common node $V_{refp}$. The voltage regulator $162_1$ controls the voltage at the node $V_{refp}$ and supplies current to the output circuits 208. The voltage regulator $162_2$ is coupled to the common node $V_{refn}$. The voltage regulator $162_2$ controls the voltage at the node $V_{refn}$ and sinks current from the output circuits 208.

The differential output (Txp, Txn) is coupled to a pair of transmission lines $212_p$ and $212_n$ (collectively transmission lines 212). The transmission lines 212 drive a load resistance $R_L$. The transmission lines 212 and the load resistance $R_L$ are not part of the output driver 118. Rather, the transmission lines 212 are part of the transmission medium 160 and the load resistance $R_L$ is part of the receiver 126.

In operation, each output circuit 208 includes a pair of inverters driven by complementary input (a differential signal of the differential input 202). Each differential signal of the differential input 202 can be one of a main-cursor signal, a post-cursor signal, or a pre-cursor signal. As discussed above, the pre-driver 115 controls the number of output circuits 208 receiving each of the main-cursor, post-cursor, and pre-cursor signals. For example, the output circuits can receive all main-cursor signals, some main-cursor signals and some pre-cursor signals, some main-cursor signals and some post-cursor signals, or some main-cursor signals, some post-cursor signals, and some pre-cursor signals. Mixing post/pre-cursor signals with the main-cursor signals is used to implement emphasis and de-emphasis equalization in the transmitter 112. In the output driver 118, equalization can be implemented by driving a different number of the output circuits 208 with different main/pre/post cursor signals.

For a voltage-mode driver, the current drawn by the output circuits 208 can be calculated using the following relationship: Id=(differential swing)/(external differential resistance+internal differential resistance). In an example, each transmission line $212_p$ and $212_n$ has a characteristic impedance $Z_0$ of 50 ohms (external differential resistance=100 ohms). Ideally, the output driver 118 provides a matching impedance of 50 ohms for each transmission line 212 (e.g., internal differential resistance=100 ohms). If the desired swing is 0.75 V, then the current drawn by the output circuits 208 is approximately 3.75 mA. The actual current consumption may be higher to account for transient switching crowbar current. For the above equation, it is noted that the current drawn by the output circuits 208 changes with the output swing. For lower swing, less current is drawn by the output circuits 208 from the voltage regulator $162_1$.

The voltage regulators 162 set the swing of the output driver 118. The differential peak-to-peak swing is $V_{refp}-V_{refn}$. For example, the voltage regulator $162_1$ can control the voltage at the common node $V_{refp}$ to be 0.75 V, and the voltage regulator $162_2$ can control the voltage at the common node $V_{refn}$ to be 0.15 V. In such an example, the output swing is 0.6 V. Each of the voltage regulators 162 can be a linear voltage regulator, such as a low drop-out (LDO) voltage regulator.

Jitter is an import specification for the output driver 118. As both supply voltages provided to the output driver 118 (e.g., voltages at common nodes $V_{refp}$ and $V_{refn}$), it is important to have the ripple be as small as possible on each supply voltage to reduce jitter. In order to achieve small ripple, the voltage regulators 162 should be fast transient regulators.

One example LDO voltage regulator applies input voltage to a pass element, which is an n-channel or p-channel FET. The pass element operates in the linear region and drops the input voltage to the desired output voltage. A voltage divider divides the output voltage and an error amplifier senses the divided output voltage. The error amplifier compares the sensed voltage to a reference voltage and drives the gate of the pass element to the appropriate operating point to control the output voltage. Such an LDO regulator has a small bandwidth. The gate node of the pass element is a high-impedance node and is designed as the dominant pole. In order to have sufficient direct current (DC) gain, the impedance at the gate node is high. The dominant pole can be in the range of kilohertz. The non-dominant pole is formed at the output node. For small output ripple, a large decoupling capacitor can be used. Thus, a considerable current is required in order to move the non-dominant pole to higher frequencies and improve the circuit bandwidth. The voltage ripple is proportional to the load current divided by a product of the output capacitance and the bandwidth. The output ripple is significantly high for large changes in the load current. Increasing the output capacitance can reduce ripple, but it also reduces bandwidth. As discussed further below, the voltage regulator shown in FIG. 3 is based on a flipped voltage follower (FVF), which solves this problem with comparatively less current.

Another example LDO voltage regulator uses an FVF architecture. An FVF LDO regulator includes replica biasing. A transistor is biased using a replica circuit including a current mirror and an error amplifier to generate the reference voltage. Such an LDO regulator includes two decoupled loops, one to control the DC output and another to reduce transients. One issue with such an LDO regulator is the DC accuracy. Such an LDO regulator is less immune to process and temperature (PVT) variations. Furthermore, the DC gain of the fast transient loop is low, which results in poor load regulation. Further, the dominant pole in the fast transient loop is formed at the output. Under large load conditions, stability of the system is a concern as the dominant pole moves to higher frequencies (e.g., a few tens of MHz, especially in technology nodes less than 28 nm).

FIG. 3 is a schematic diagram of a voltage regulator 300 according to an example. The voltage regulator 300 is an LDO voltage regulator that can be used as the voltage regulator $162_2$ described above. Those skilled in the art will appreciate that the voltage regulator 300 can be used in a myriad of other applications that make use of a low drop-out, linear voltage regulator.

Figure 4:
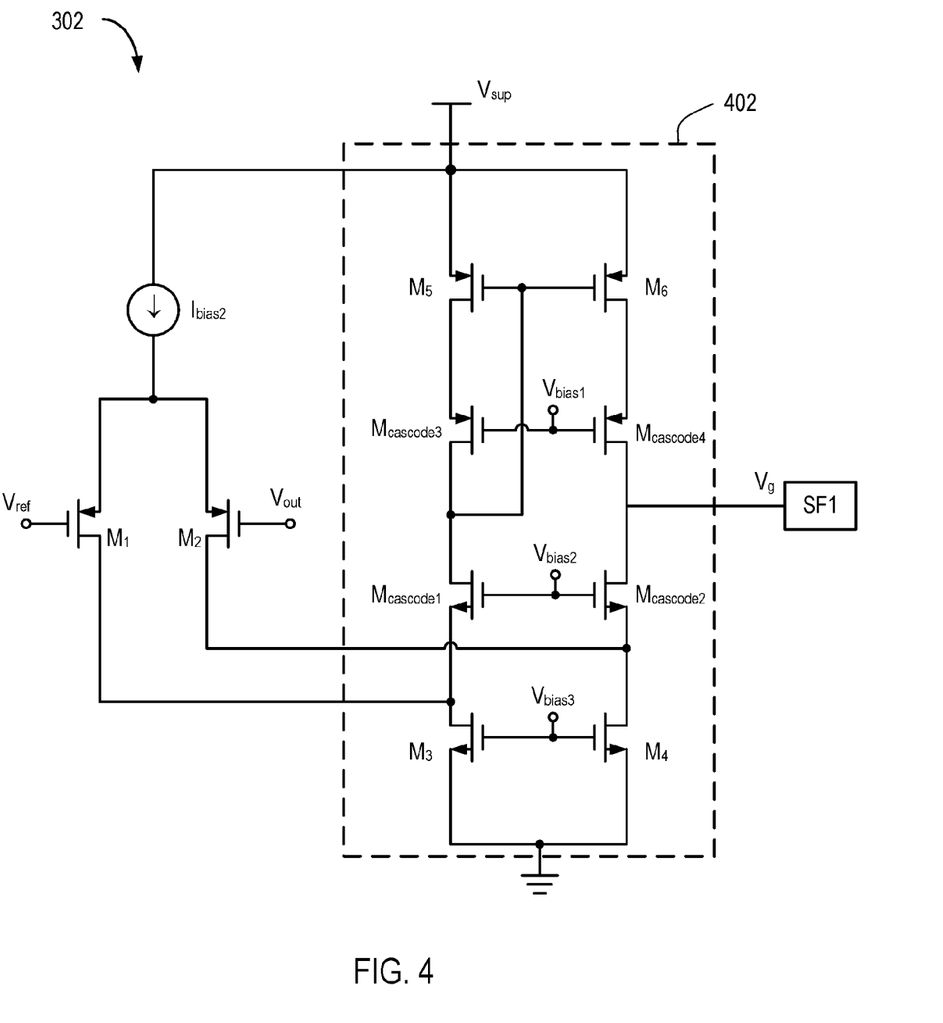
FIG. 4 is a schematic diagram depicting an error amplifier for the voltage regulator of FIG. 3 according to an example.

The voltage regulator 300 includes transistors $M_{Power}$, $M_{SF1}$, and $M_{SF2}$. The voltage regulator 300 further includes a resistor R1, a current source $I_{bias1}$, and an error amplifier 302. The transistors $M_{Power}$, $M_{SF1}$, and $M_{SF2}$ are n-channel FETs, such as NMOS transistors. The transistor $M_{Power}$ includes a source coupled to a first voltage node (designated as electrical ground in the example), a base coupled to a node $V_2$, and a drain coupled to a node $V_{out}$. The transistor $M_{SF1}$ includes a source coupled to the node $V_{out}$, a base coupled to an output of the error amplifier 302, and a drain coupled to a node $V_1$. The resistor R1 is coupled between a second supply node (designated $V_{sup}$ in the example) and the node $V_1$. The transistor $M_{SF2}$ includes a source coupled to the node $V_2$, a drain coupled to the supply node $V_{Sup}$, and a base coupled to the node $V_1$. The current source $I_{bias}$ is coupled between the node $V_2$ and the ground node. In the example, the current source $I_{bias1}$ sources current away from the node $V_2$. The error amplifier 302 includes supply inputs coupled to the node $V_{sup}$ and the ground node, respectively. The error amplifier 302 further includes a non-inverting input coupled to a node $V_{ref}$ and an inverting input coupled to the node $V_{out}$. An example of the error amplifier 302 is shown in FIG. 4 and described below. A capacitor $C_{out}$ is coupled between the node $V_{out}$ and the ground node.

In operation, the voltage regulator 300 generates a regulated output voltage at the node $V_{out}$ from a supply voltage between the node $V_{sup}$ and the ground node. The regulated output voltage appears across the drain and source of the transistor $M_{Power}$ (e.g., the regulated output voltage is $V_{DS}$ of the transistor $M_{power}$). The transistor $M_{Power}$ is also referred to herein as an output transistor. A load $R_{Load}$ can be coupled between a supply voltage (e.g., $V_{refp}$ in FIG. 2) and the node $V_{out}$ of the voltage regulator 300. Thus, in an example, the voltage at $V_{out}$ is the voltage $V_{refn}$ shown in FIG. 2. The load $R_{Load}$ supplies a DC current, $I_{Load}$, which is sinked by the transistor $M_{Power}$. The transistor $M_{Power}$ conducts a current $I_{DS}$ that includes the load current $I_{Load}$ and a drain-to-source current of the transistor $M_{SF1}$. The transistor $M_{Power}$ is a power MOSFET or the like sized to accommodate a desired range of load current supplied by the load $R_{Load}$.

The voltage regulator 300 regulates the output voltage by controlling the voltage at the node $V_{out}$ using a DC regulation loop and a fast transient loop. The DC regulation loop includes a first source follower (SF1) that controls the output voltage at the node $V_{out}$ and the error amplifier 302, which controls the first source follower. The first source follower is formed by the transistor $M_{SF1}$ and the transistor $M_{Power}$. The input of the first source follower is a voltage $V_g$ output by the error amplifier 302. An output of the first source follower is the node $V_{out}$. A common input to the first source follower is the node $V_1$. The DC regulation loop includes the voltage $V_g$ applied to the gate of the transistor $M_{SF1}$, which controls the voltage at the node $V_{out}$, which is fed back to the non-inverting input of the error amplifier 302, which generates the voltage $V_g$. The error amplifier 302 sets the operating point of the transistor $M_{SF1}$ so that the difference between the voltage $V_{ref}$ and $V_{out}$ is substantially zero.

The fast transient loop includes a second source follower (SF2), the resistor R1, and the first source follower (SF1). The second source follower (SF2) includes the transistor $M_{SF2}$ and the current source $I_{bias1}$. The input of the second source follower is the voltage at the node $V_1$. An output of the first source follower is the node $V_2$. A common input to the first source follower is the supply node $V_{sup}$. The drain-to-source current of the transistor $M_{SF2}$ is set to the current $I_{bias1}$. The second source follower controls the transistor $M_{Power}$ by controlling the voltage at the node $V_2$. The voltage between the resistor R1 and the first source follower (SF1) (the node $V_1$) controls the second source follower (e.g., the gate voltage of the transistor $M_{SF2}$). The transistor $M_{SF2}$ acts as a level-shifter and creates a low impedance node at the gate of the transistor $M_{Power}$. The dominant pole is at the output node $V_{out}$ and two non-dominant poles are in the gigahertz (GHz) range. This allows the voltage regulator 300 to achieve high bandwidth. This significantly mitigates output ripple at the node $V_{out}$. Rather than using two separate loops, the DC regulation loop and the fast transient loop are coupled in the voltage regulator 300 (through the first source follower SF1).

Compared to the example LDO regulators described above, the DC accuracy of the voltage regulator 300 is higher. When the load current Load increases, the gate voltage of the transistor $M_{Power}$ increases through action of the fast transient loop to sink the additional load current. Conversely, when the load current $I_{Load}$ decreases, the gate voltage of the transistor $M_{Power}$ decreases through active of the fast transient loop to respond to the change in $I_{DS}$ of the transistor $M_{Power}$. The voltage $V_g$ at the gate of the transistor $M_{SF1}$ is almost constant, which results in less variations for the DC gain for different load currents and improves load regulation.

In an embodiment, the error amplifier 302 includes a folded cascoded amplifier. An example of the error amplifier 302 is shown in FIG. 4. The output voltage at the node $V_{out}$ is directly fed back to the error amplifier 302, rather than a divided output voltage. When the error amplifier 302 is based on a folded cascaded amplifier, the DC gain is high, which provides immunity to PVT variations. Although the DC gain of the fast transient loop is low, the high DC gain of the error amplifier 302 compensates, resulting in small variations of the voltage $V_g$ at the gate of the transistor $M_{SF1}$. Thus, the output voltage at the node $V_{out}$ is substantially constant and results in good load regulation.

The resistor R1 is used in the fast transient loop to generate the voltage $V_1$ rather than use of a current mirror. Since the voltage regulator 300 is not based on replica biasing, using the resistor R1 instead of a current mirror in the fast transient loop has minimal impact on the DC accuracy. The resistor R1 also allows the non-dominant pole to be pushed to higher frequencies without a significant increase in the quiescent current.

FIG. 4 is a schematic diagram depicting the error amplifier 302 according to an example. The error amplifier 302 includes a source-coupled transistor pair ($M_1$, $M_2$), a current source $I_{bias2}$, and a cascode branch circuit 402. The cascode branch circuit 402 (also referred to as an output circuit) includes a base-coupled transistor pair ($M_3$, $M_4$), a base-coupled transistor pair ($M_{cascode1}$, $M_{cascode2}$), a base-coupled transistor pair ($M_{cascode3}$, $M_{cascode4}$), and a base-coupled transistor pair ($M_5$, $M_6$). The transistor $M_1$ includes a source coupled to the source of the transistor $M_2$. The transistor $M_1$ includes a base coupled to a node $V_{ref}$ and a drain coupled to a drain of the transistor $M_3$. The transistor $M_2$ includes a base coupled to the node $V_{out}$ and a drain coupled to a drain of the transistor $M_4$. The current source $I_{bias2}$ is coupled between the supply node $V_{sup}$ and the source node of the source-coupled transistor pair ($M_1$, $M_2$). The transistors $M_1$ and $M_2$ are p-channel FETs, such as PMOS transistors.

The transistor $M_3$ includes a source coupled to the ground node, a base coupled to a node $V_{bias3}$, and a drain coupled to a source of the transistor $M_{cascode1}$. The transistor $M_4$ includes a source coupled to the ground node, a base coupled to a node $V_{bias3}$, and a drain coupled to a source of the transistor $M_{cascode2}$. The transistor $M_{cascode1}$ includes a base coupled to a node $V_{bias2}$ and a drain coupled to the drain of the transistor $M_{cascode3}$. The transistor $M_{cascode2}$ includes a base coupled to a node $V_{bias2}$ and a drain coupled to the drain of the transistor $M_{cascode4}$. The transistor $M_{cascode3}$ includes a base coupled to the node $V_{bias1}$ and a source coupled to a drain of the transistor $M_5$. The transistor $M_{cascode4}$ includes a base coupled to the node $V_{bias1}$ and a source coupled to a drain of the transistor $M_6$. The transistor $M_6$ includes a base coupled to a node including the base of the transistor $M_6$ and another node that includes the drains of the transistors $M_{cascode1}$ and $M_{cascode3}$. The transistor $M_6$ includes a source coupled to the supply node $V_{sup}$. The transistor $M_6$ includes a source coupled to the supply node $V_{sup}$. The transistors $M_{cascode1}$, $M_{cascode2}$, $M_3$, and $M_4$ are n-channel FETs, such as NMOS transistors. The transistors $M_{cascode3}$, $M_{cascode4}$, $M_5$, and $M_6$ are p-channel FETs, such as PMOS transistors. A node including the drains of the transistors $M_{cascode4}$ and $M_{cascode2}$ provides the voltage $V_g$ coupled to the input of the source follower SF1 shown in FIG. 3 (e.g., the base of the transistors $M_{SF1}$).

In operation, the transistor pair ($M_3$, $M_4$) are load transistors for the source-coupled pair ($M_1$, $M_2$). The transistors $M_3$ and $M_4$ are gate-biased into saturation by a bias source (not shown) coupled to the node $V_{bias3}$. Likewise, the cascode pair ($M_{cascode1}$, $M_{cascode2}$) and the cascode pair ($M_{cascode3}$, $M_{cascode4}$) are gate-biased into saturation by bias sources (not shown) coupled to the nodes $V_{bias2}$ and $V_{bias1}$, respectively. The transistors $M_5$ and $M_{cascode3}$ form a cascode current mirror whose current is reflected to the transistor $M_6$. The transistors ($M_1$, $M_2$) together with the current source $I_{bias2}$ steer a tail current between the two sides of the source-coupled pair to the load transistors ($M_3$, $M_4$) in response to a differential input voltage ($V_{ref}$-$V_{out}$). When the voltage $V_{ref}$ is equal to the voltage $V_{out}$, an equal current $I_{bias2}/2$ flows to each of the load transistors $M_3$ and $M_4$.

The load transistors $M_3$ and $M_4$ also receive a fixed current produced by the current mirror ($M_5$, $M_{cascode3}$) and associated transistors $M_6$, $M_{cascode1}$, $M_{cascode2}$, and $M_{cascode4}$. When the input voltages are equal, the drain-to-source current through load transistors $M_3$ and $M_4$ is equal to one half of $I_{bias2}$ plus the current of the current mirror and cascoded transistors. An imbalance in the input voltage ($V_{ref}$-$V_{out}$) causes an imbalance in current between the branches of the cascode branch circuit 402, which in turn shifts the voltage $V_g$ in same direction as the change in the input voltage. Thus, if $V_{out}$>$V_{ref}$, then $V_g$ is driven lower, which in turn causes the source follower SF1 to drive the output node $V_{out}$ lower. If $V_{out}$<$V_{ref}$, then $V_g$ is driven higher, which in turn cases the source follower SF1 to drive the output node $V_{out}$ higher. The high gain of the error amplifier 302 ensures that, in steady state, $V_g$ includes only small variations from a constant value.

While the foregoing is directed to specific examples, other and further examples may be devised without departing from the basic scope thereof, and the scope thereof is determined by the claims that follow.

What is claimed is:

1. A voltage regulator, comprising:
   an output transistor that includes a source coupled to a first voltage supply node and a drain coupled to an output node;
   a first transistor that includes a source coupled to the output node;
   a second transistor that includes a source coupled to a gate of the output transistor and a drain coupled to a second voltage supply node;
   a resistor coupled between the second voltage supply node and a first node that includes the drain of the first transistor and a gate of the second transistor; and
   an error amplifier that includes a first input coupled to a reference voltage node, a second input coupled to the output node, and an output coupled to a gate of the first transistor.

2. The voltage regulator of claim 1, further comprising:
   a current source coupled between the first voltage supply node and a second node that includes the source of the second transistor and the gate of the output transistor.

3. The voltage regulator of claim 1, wherein each of the output transistor, the first transistor, and the second transistor is an n-channel field effect transistor (FET).

4. The voltage regulator of claim 1, wherein a voltage between the first voltage supply node and the second voltage supply node is an input voltage of the voltage regulator, and wherein a voltage of the output node is an output voltage of the voltage regulator.

5. The voltage regulator of claim 1, further comprising:
   a capacitor coupled between the output node and the first voltage supply node.

6. The voltage regulator of claim 1, wherein the error amplifier includes a folded cascode amplifier.

7. The voltage regulator of claim 6, wherein the folded cascode amplifier includes a source-coupled transistor pair, which includes a source node coupled to a current source and drains coupled to an output circuit, wherein the output circuit is disposed between the first voltage supply node and the second voltage supply node, and wherein gates of the source-coupled transistor pair are coupled to the reference voltage node and the output node, respectively.

8. The voltage regulator of claim 7, wherein the output circuit includes:
   a first gate-coupled transistor pair that includes sources coupled to the first voltage supply node and drains respectively coupled to the drains of the source-coupled transistor pair; and
   second, third, and fourth gate-coupled transistor pairs coupled in cascode between the second voltage supply node and the first gate-coupled transistor pair.

9. A driver circuit, comprising:
a voltage-mode output driver; and
a voltage regulator coupled to the voltage-mode output driver, the voltage regulator providing an output voltage to the voltage-mode output driver, the voltage regulator including:
an output transistor that includes a source coupled to a first voltage supply node and a drain coupled to an output node, which supplies the output voltage;
a first transistor that includes a source coupled to the output node;
a second transistor that includes a source coupled to a gate of the output transistor and a drain coupled to a second voltage supply node;
a resistor coupled between the second voltage supply node and a first node that includes the drain of the first transistor and a gate of the second transistor; and
an error amplifier that includes a first input coupled to a reference voltage node, a second input coupled to the output node, and an output coupled to a gate of the first transistor.

10. The driver circuit of claim 9, further comprising:
a current source coupled between the first voltage supply node and a second node that includes the source of the second transistor and the gate of the output transistor.

11. The driver circuit of claim 9, wherein each of the output transistor, the first transistor, and the second transistor is an n-channel field effect transistor (FET).

12. The driver circuit of claim 9, wherein the voltage regulator is configured to sink current from the voltage-mode output driver.

13. The driver circuit of claim 9, further comprising:
a capacitor coupled between the output node and the first voltage supply node.

14. The driver circuit of claim 9, wherein the error amplifier includes a folded cascode amplifier.

15. The driver circuit of claim 14, wherein the folded cascode amplifier includes a source-coupled transistor pair, which includes a source node coupled to a current source and drains coupled to an output circuit, wherein the output circuit is disposed between the first voltage supply node and the second voltage supply node, and wherein gates of the source-coupled transistor pair are coupled to the reference voltage node and the output node, respectively.

16. The driver circuit of claim 15, wherein the output circuit includes:
a first gate-coupled transistor pair that includes sources coupled to the first voltage supply node and drains respectively coupled to the drains of the source-coupled transistor pair; and
second, third, and fourth gate-coupled transistor pairs coupled in cascode between the second voltage supply node and the first gate-coupled transistor pair.

17. A voltage regulator, comprising:
an output transistor that includes a source coupled to a first voltage supply node and a drain coupled to an output node that supplies a regulated output voltage;
a DC regulation loop that includes a first source follower configured to control the regulated output voltage and an error amplifier configured to control the first source follower; and
a fast transient loop that includes a second source follower, a resistor, and the first source follower, the second source follower configured to control the output transistor;
wherein a voltage between the resistor and the first source follower controls the second source follower.

18. The voltage regulator of claim 17, wherein the first source follower comprises a first transistor and the output transistor, and the error amplifier is configure to compare the regulated output voltage with a reference voltage to control the regulated output voltage through the first source follower.

19. The voltage regulator of claim 18, wherein a difference between the regulated output voltage and the reference voltage drives a source-coupled transistor pair of the error amplifier, and wherein the source-coupled transistor pair drives a cascode branch circuit to output a voltage for controlling the first source follower.

20. The voltage regulator of claim 18, wherein the second source follower comprises a second transistor and a current source, and wherein the resistor is coupled between the second supply node and the first source follower.

* * * * *